(12) United States Patent
Shoenmaekers et al.

(10) Patent No.: US 10,757,768 B2
(45) Date of Patent: Aug. 25, 2020

(54) LIGHT CONVERTING DEVICE HAVING A WAVELENGTH CONVERTING LAYER WITH A HYDROPHOBIC NANOSTRUCTURE

(71) Applicant: PHILIPS LIGHTING HOLDING B.V., Eindhoven (NL)

(72) Inventors: Jordy Bernard Margreth Shoenmaekers, Ubachsberg (NL); Peter Johannes Martinus Bukkems, Deurne (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/084,296

(22) PCT Filed: Mar. 29, 2017

(86) PCT No.: PCT/EP2017/057413
§ 371 (c)(1),
(2) Date: Sep. 12, 2018

(87) PCT Pub. No.: WO2017/174416
PCT Pub. Date: Oct. 12, 2017

(65) Prior Publication Data
US 2019/0090325 A1 Mar. 21, 2019

(30) Foreign Application Priority Data
Apr. 5, 2016 (EP) .................... 16163794

(51) Int. Cl.
*H01L 33/50* (2010.01)
*H05B 33/14* (2006.01)
(Continued)

(52) U.S. Cl.
CPC ............. *H05B 33/14* (2013.01); *H01L 33/44* (2013.01); *H01L 33/501* (2013.01);
(Continued)

(58) Field of Classification Search
CPC ....... H05B 33/14; H01L 33/504; H01L 33/56; H01L 33/54; H01L 33/508; H01L 33/505;
(Continued)

(56) References Cited

U.S. PATENT DOCUMENTS 8,575,646 B1   11/2013  Shum
2008/0064131 A1*  3/2008  Chang ............... G02F 1/133603
                                                                438/29
(Continued)

FOREIGN PATENT DOCUMENTS

EP     2866271 A1    4/2015
WO  2009005311 A2    1/2009
(Continued)

OTHER PUBLICATIONS

M. van 't Hoff et al, "A Programmable Light Engine for Quantitative Single Molecule TIRF and HILO Imaging", Optics Express, vol. 16, No. 22, Oct. 2008, pp. 18495-18504.
(Continued)

*Primary Examiner* — Cuong B Nguyen
(74) *Attorney, Agent, or Firm* — Daniel J. Piotrowski

(57) ABSTRACT

The present invention relates to a light converting device (11) comprising a solid state light source (2) and a wavelength converting layer (3) arranged to at least partly wavelength convert the light emitted, in use, by the solid state light source (2), the wavelength converting layer (3) having a back side (4) facing the solid state light source (2) and a front side (5) opposite the back side (4), wherein the front side (5) of the wavelength converting layer (3) defines an exit window of the light converting device (11). The light converting device (11) further comprises a hydrophobic nanostructure (6) having spaced apart protrusions (66) arranged on the front side (5) of the wavelength converting
(Continued)

layer (3) and a protective coating (7) applied on top of the hydrophobic nanostructure (6).

6 Claims, 4 Drawing Sheets

(51) Int. Cl.
    *H01L 33/44*     (2010.01)
    *H01L 33/54*     (2010.01)
    *H01L 33/56*     (2010.01)
    *B82Y 30/00*     (2011.01)
    *H01L 25/075*     (2006.01)
    *B82Y 40/00*     (2011.01)
    *B82Y 20/00*     (2011.01)

(52) U.S. Cl.
    CPC .......... *H01L 33/504* (2013.01); *H01L 33/505* (2013.01); *H01L 33/508* (2013.01); *H01L 33/54* (2013.01); *H01L 33/56* (2013.01); *B82Y 20/00* (2013.01); *B82Y 30/00* (2013.01); *B82Y 40/00* (2013.01); *H01L 25/0753* (2013.01); *H01L 2933/0025* (2013.01); *H01L 2933/0041* (2013.01)

(58) Field of Classification Search
    CPC ................... H01L 33/501; H01L 33/44; H01L 2933/0041; H01L 2933/0025; H01L 25/0753; H01L 33/0004–648
    See application file for complete search history.

(56) References Cited

U.S. PATENT DOCUMENTS

| | | |
|---|---|---|
| 2011/0018012 A1* | 1/2011 | Tanaka ...................... F21V 3/00 257/89 |
| 2012/0086028 A1 | 4/2012 | Beeson et al. |
| 2013/0087822 A1 | 4/2013 | Kim |
| 2013/0328066 A1 | 12/2013 | Sabathil et al. |

FOREIGN PATENT DOCUMENTS

| | | |
|---|---|---|
| WO | 2009119034 A1 | 10/2009 |
| WO | 2010001306 A1 | 1/2010 |
| WO | 2013171284 A1 | 11/2013 |
| WO | 2016046216 A1 | 3/2016 |

OTHER PUBLICATIONS

M. Oheun et al, "Non-linear Evanescent-field Imaging", J. Phys. D.: Appl. Phys., vol. 38, No. 10, R185-R197, May 2005.

F. Schapper et al, "Fluorescence Imaging with Two-Photon Evanescent Wave Excitation", Eur. Biophys J., vol. 32, Issue 7, Nov. 2003, pp. 635-643.

M. Oheim et al, "The Last Few Millisecond in the Life of a Secretory Granule", 1998 Eur. Biophys. J., vol. 27, pp. 83-98.

* cited by examiner

LIGHT CONVERTING DEVICE HAVING A WAVELENGTH CONVERTING LAYER WITH A HYDROPHOBIC NANOSTRUCTURE

CROSS-REFERENCE TO PRIOR APPLICATIONS

This application is the U.S. National Phase application under 35 U.S.C. § 371 of International Application No. PCT/EP2017/057413, filed on Mar. 29, 2017 which claims the benefit of European Patent Application No. 16163794.7, filed on Apr. 5, 2016. These applications are hereby incorporated by reference herein.

FIELD OF THE INVENTION

The present invention relates to a light converting device having a wavelength converting layer.

BACKGROUND OF THE INVENTION

Lighting devices based on solid state lighting technology which comprise a wavelength converting layer are known in the art, such lighting devices are referred to as light converting devices. The wavelength converting layer enables the use of more efficient light sources which, in use, do not emit light of a desired color. The wavelength converting layer converts the emitted light from the light source into the desired color. However, it is often required to protect the surface of the wavelength converting layer with a protective coating, and as the material of the protective coating has a different refracting index than the surrounding air, the spectrum of the light emitted from the light converting device is therefore altered due to refraction in the interface between the wavelength converting layer and the protective layer. This can be counteracted by altering the spectrum of the light emitted, in use, by the light source, or by altering the refractive index of the wavelength converting layer. However, different materials each have their own refractive index and the light converting device thus has to be tuned for different material, adding cost and complexity to the product and the process.

U.S. Pat. No. 8,575,646 proposes the use of a hydrophobic surface to control wetting for the purpose of creating a lens of silicone for a device having a solid state light source. This construction provides no solution to the above problem.

Hence, there is still a desire to find a solution which improves light converting devices to provide a desired spectrum of emitted light without significant modifications so that addition of unnecessary costs and complexity to the production process is avoided.

SUMMARY OF THE INVENTION

It is an object of the present invention to improve the current state of the art, to solve at least some of the above problems, and to provide an improved light converting device. These and other objects are achieved by a light converting device according to the appended claims.

According to a first aspect of the present invention, there is provided a light converting device comprising:
  a solid state light source;
  a wavelength converting layer arranged to at least partly wavelength convert the light emitted by the solid state light source, the wavelength converting layer having a back side facing the solid state light source and a front side opposite the backside, wherein the front side of the wavelength converting layer defines an exit window of the light converting device; and
  wherein the light converting device further comprises a hydrophobic nanostructure arranged on the front side of the wavelength converting layer.

The present invention is based on the realization that liquids or other undesired materials placed in close proximity to the exit window may cause a color shift in the light being emitted, in use, by the light converting device as the evanescent wave of totally internally reflected (TIR) unconverted wavelengths may be emitted from the light converting device, by being optically coupled to the undesired materials and thereby alter the spectrum of light in an undesirable manner. To prevent or reduce such a color shift from occurring, a hydrophobic nanostructure is arranged on the front side of the wavelength converting layer. Thereby, liquids and other types of unwanted materials may be at least distanced from the surface of the front side of the wavelength converting material or removed as they do not adhere to the surface by the hydrophobic nanostructure. The hydrophobic nanostructure thus provides an air layer close to the front side of the wavelength converting layer such that a color shift is prevented by allowing the evanescent wave to interact with the air layer instead. An advantage is thus that a simple and cost-effective light converting device which provides a desired color is provided.

Close proximity should be understood as a distance which is small enough that optical contact or optical coupling may occur between the wavelength converting layer and the liquid or other undesired material.

The air layer should be understood to be the air in the nanostructure above the front side of the wavelength converting layer to the end of the nanostructure.

A hydrophobic nanostructure provides the front side of the wavelength converting layer with hydrophobic properties by use of the so-called lotus effect. Thereby, liquids on the nanostructure have a high contact angle and easily roll of the surface. Further, the hydrophobic property makes it less likely that unwanted materials stick to the nanostructure and thus the front side of the wavelength converting layer.

In at least one exemplary embodiment, the hydrophobic nanostructure comprises spaced apart protrusions. Alternatively, the hydrophobic nanostructure may comprise spaced apart indentations. The skilled addressee realizes that whichever the case, the hydrophobic nanostructure keeps liquids or other unwanted materials at a distance from the interface between the wavelength converting material and the surrounding environment, e.g. air, such that an air layer is provided between the front side of the wavelength converting layer and the tip of the protrusions.

In at least one exemplary embodiment, the height of the spaced apart protrusions is selected be larger than the penetration depth of an evanescent wave of light being totally internally reflected at the front side of the wavelength converting layer.

In at least one exemplary embodiment, the height of the hydrophobic nanostructure is at least 50 nm, or 75 nm, or 100 nm, or 125 nm, or 150 nm, or 175 nm, or 200 nm. For example, the height of the protrusions may be at least 180 nm. The evanescent wave decays exponentially outside the interface in which a beam of light is reflected, therefore a hydrophobic nanostructure reduces the likelihood of the evanescent wave coupling to a material placed on top of a hydrophobic nanostructure of sufficient height. Preferably, the height nanostructure is selected to be larger than the penetration depth of the evanescent wave.

In at least one exemplary embodiment, the light converting device further comprises a hydrophobic coating on the front side of the wavelength converting layer. A hydrophobic coating comprises a material which provides a low surface energy. A low surface energy is beneficial for the hydrophobic properties. Hydrophobic materials such as fluorocarbons or styrenes such as PTFE are known in the art to be hydrophobic. Other known materials may of course also be used to advantage. The hydrophobic coating may be a thin layer, such as 1 nm to 25 nm thick, applied on the front side and thus also on the hydrophobic nanostructure on the front side of the wavelength converting layer.

In at least one exemplary embodiment, the light converting device further comprises a protective coating applied on top of the hydrophobic nanostructure. In at least one exemplary embodiment, the protective coating is silicone or polyurethane. The protective coating is applied to protect the light converting device from, for example mechanical wear and tear and particles. The hydrophobic nanostructure allows the protective coating to be distanced from the front side of the wavelength converting layer, and thus provides an air layer with which evanescent wave can interact.

According to a further aspect of the present invention, there is provided a lighting system comprising a plurality of light converting devices according to the first aspect arranged on a carrier and electrically connected to each other.

Effects and features of this further aspect of the present invention are largely analogous to those described above in connection with the first aspect of the inventive concept. Embodiments mentioned in relation to the first aspect of the present invention are largely compatible with the second aspect of the invention. Thus, a lighting system may be formed by arranging a plurality of light converting device on a carrier and electrically connecting the light converting devices such that more light is provided from the lighting system than from a single light converting device. The lighting system may be a lamp, a strip, a luminaire or the like.

According to a further aspect of the present invention, there is provided a method for manufacturing a light converting device, the method comprises the steps of;
  providing a solid state light source;
  arranging a wavelength converting layer to at least partly wavelength convert the light emitted, in use, by the solid state light source, the wavelength converting layer having a backside facing the solid state light source and a front side opposite the backside, wherein the front side of the wavelength converting layer defines an exit window of the light converting device; and
  providing a hydrophobic nanostructure arranged on the front side of the wavelength converting layer.

Effects and features of this further aspect of the present invention are largely analogous to those described above in connection with the first aspect of the inventive concept. Embodiments mentioned in relation to the first aspect of the present invention are largely compatible with the second aspect of the invention.

In at least one exemplary embodiment, the step of providing a hydrophobic nanostructure arranged on the front side of the wavelength converting layer comprises:
  removing material from the wavelength converting layer to provide the hydrophobic nanostructure.

In at least one exemplary embodiment, removing material comprises at least one of laser ablation, etching, or a phase mask.

In at least one exemplary embodiment, the step of providing a hydrophobic nanostructure arranged on the front side of the wavelength converting layer comprises:
  adding material to the wavelength converting layer to provide the hydrophobic nanostructure.

In at least one exemplary embodiment, adding material comprises utilizing a self-assembled array or vapor deposition.

Generally, all terms used in the claims are to be interpreted according to their ordinary meaning in the technical field, unless explicitly defined otherwise herein. All references to "a/an/the [element, device, component, means, step, etc.]" are to be interpreted openly as referring to at least one instance of said element, device, component, means, step, etc., unless explicitly stated otherwise.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

DETAILED DESCRIPTION

Figure 1:
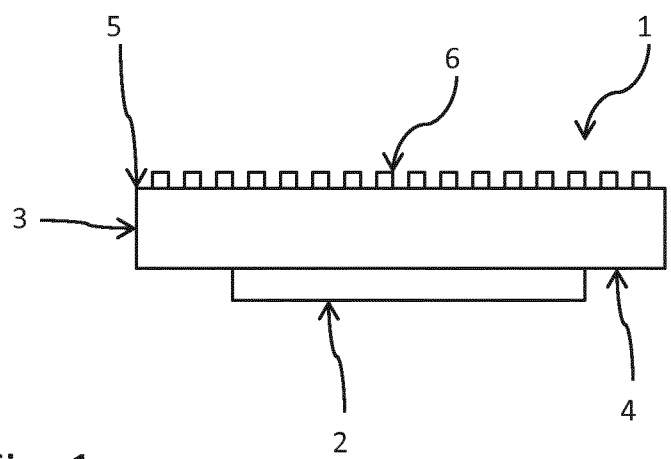
FIG. 1 is a side view of a light converting device in accordance with at least one embodiment of the invention.

In the present detailed description, exemplary embodiments of a light converting device according to the present invention are mainly discussed with reference to schematic views showing a light converting device according to various embodiments of the invention. It should be noted that this by no means limits the scope of the invention, which is also applicable in other circumstances for instance with other types or variants of light converting device or components than the embodiments shown in the appended drawings. Further, that specific components are mentioned in connection to an embodiment of the invention does not mean that those components cannot be used to an advantage together with other embodiments of the invention. The invention will now be described with reference to the enclosed drawings where first attention will be drawn to the structure, and secondly to the function. Like reference characters refer to like elements throughout the description.

FIG. 1 shows an example of a light converting device 1. The light converting device 1 comprises a solid state light source 2 and a wavelength converting layer 3. The wavelength converting layer 3 has a backside 4 facing the light source 2, and a front side 5 facing away from the light source 2. A hydrophobic nanostructure 6 is provided on the front side 5 of the wavelength converting layer 3. The light converting device 1 may further comprise a housing and/or support (not shown) at least partially surrounding the light source 2 and the wavelength converting layer 3.

The solid state light source 2 may be a light emitting diode (LED), a laser diode or any other kind of solid state light source. The light generated by the solid state light source 2 in this example substantially comprises a single wavelength or wavelengths around a single wavelength. Typically, the wavelength emitted from such solid state light sources is blue light, with a wavelength around 450 nm in order for the light to be able to be converted to longer wavelengths in a wavelength converter by reducing the energy of the light. The solid state light source 2 may be connected to an electrical circuit for providing electrical power to the solid state light source (not shown). Such an electrical circuit is typically called a driver circuit or driver circuitry, and converts the high voltage AC current in mains electricity to lower level DC current suitable to drive the solid state light source 2.

The wavelength converting layer 3 is arranged in front of the solid state light source 2 to receive light emitted, in use, by the solid state light source 2. Thereby, the front side 5 of the wavelength converting layer also defines an exit window of the light converting device 1. The exit window is the window through which light emitted by the light converting device 1, in use, to the surrounding environment. The wavelength converting layer 3 may be arranged in direct contact with the solid state light source 2 to receive substantially all light generated, in use, by the solid state light source 2. The wavelength converting layer 3 is used for altering the color of the light emitted by the solid state light source 2. A common technique to provide white light is to combine a non-white light source, i.e. the solid state light source 2, with the wavelength converting layer to provide white light by allowing some of the light from the solid state light source 2 to be converted into light of other wavelengths such that the total spectrum of light emitted from the light converting device 1 is white light. The wavelength converting layer is configured, i.e. has a refractive index, such that a predetermined portion of the light emitted from the exit window comprises converted and unconverted light based on the surrounding environment being air (i.e. having a refractive index close to 1). Typically, the wavelength converting layer 3 has a refractive index of about 1.5. Hence, the wavelength converting layer 3 converts some of the light emitted by the solid state light source 2 to a longer wavelength such that the mix of converted and unconverted light appears white or almost white to the eye. The wavelength converting layer 3 comprise materials having one or more phosphors, such as YAG, LuAG and ECAS. The thickness of the wavelength converting layer 3 may be in the range of 0.1 mm to 2 mm.

The hydrophobic nanostructure 6 is arranged on the front side 5 of the wavelength converting layer 3 to prevent liquids or other unwanted materials from being placed in close proximity or contact with the front side 5 of the light converting layer. Such liquids or other unwanted materials may cause a color shift in the light being emitted, in use, by the light converting device 1 as the evanescent wave of otherwise totally internally reflected (TIR) wavelengths may be emitted from the light converting device 1 and thereby alter the spectrum of the emitted light in an undesirable manner.

In use, the solid state light source 2 emits light comprising a single wavelength or wavelengths around a single wavelength. The light from the solid state light source 2 enters the wavelength converting layer 3 via the back side 4. The light is then down converted, i.e. the energy is reduced, to converted light having a longer wavelength. The converted light and a portion of the light which is unconverted are then emitted from the front side 5 of the wavelength converting layer 3 to reach the surrounding environment as light having a desired color. The hydrophobic nanostructure 6 prevents a color shift caused by materials being placed on the front side 5 of the wavelength converting layer 3, as such materials may cause an undesired coupling of the unconverted light.

Figure 2:
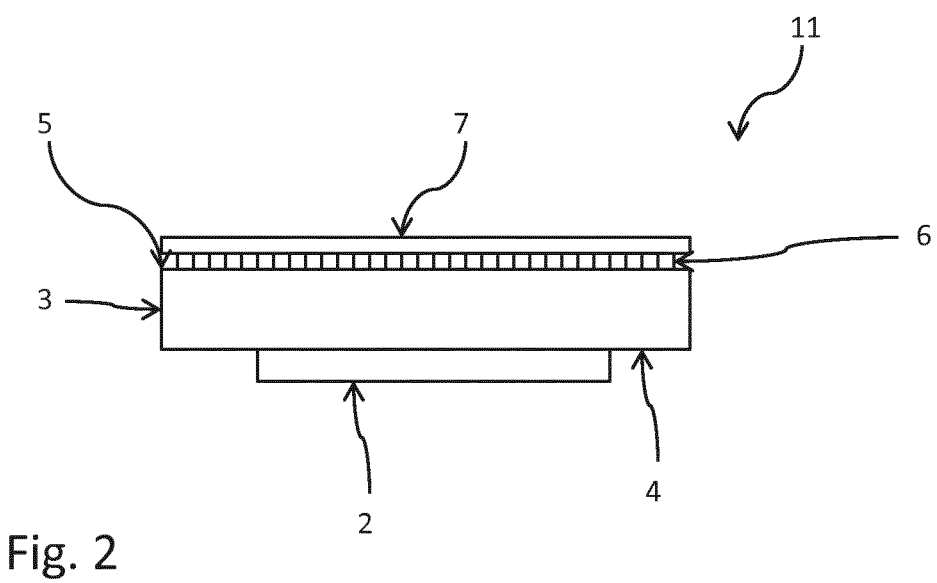
FIG. 2 is a side view of a light converting device in accordance with at least another embodiment of the invention.

FIG. 2 shows another example of a light converting device 11. The only difference between the light converting device 11 and the light converting device 1 of FIG. 1 is that the light converting device 11 further comprises a protective coating 7 applied on top of the hydrophobic nanostructure 6. The protective coating 7 may be made of silicone or polyurethane. As the protective coating is applied on top of the hydrophobic nanostructure 6, the light which, in use, is totally internally reflected at the front side 5 of the wavelength converting layer interacts with air as the second medium between the front side 5 of the wavelength converting layer and the protective coating 7 and therefore the light emitted from the front side 5 of the wavelength converting layer may comprises a desired portion of converted and a desired portion of unconverted light to provide a desired color.

The light converting devices 1, 11 may be provided with a hydrophobic coating (not shown) on the front side 5 of the wavelength converting layer and on the hydrophobic nanostructure to further improve the hydrophobic properties of the hydrophobic nanostructure 6.

Figure 3A:
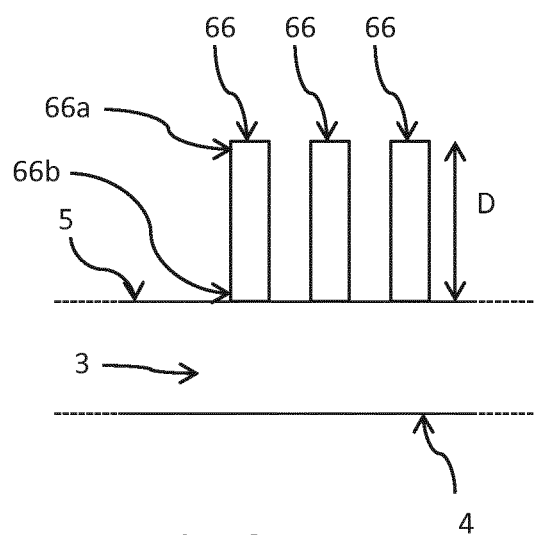
FIGS. 3a-d is schematic side and top views of a hydrophobic nanostructure in accordance with embodiments of the invention.

FIG. 3a shows a schematic side view of the hydrophobic nanostructure 6 comprising a plurality of protrusions 66. For the sake of brevity, only three protrusions 66 are shown in FIG. 3a, it is of course understood that a hydrophobic nanostructure comprises a large number of protrusions, such as hundreds or even thousands of protrusions. The protrusions 66 are spaced apart and each have a distal tip 66a, distal to the front side 5 of the wavelength converting layer 3, and a proximal base 66b arranged on the front side 5 of the wavelength converting layer 3. The height D of the protrusions 66 may be configured to be larger than the penetration depth of an evanescent wave of light being totally internally reflected in the interface at the front side 5. Stated differently, the height of the protrusions 66 from the base 66b to the tip 66a is chosen such that the air layer created between the front side 5 of the wavelength converting layer and the tip 66a on which an undesired material, or a protective coating is placed is of sufficient thickness that the evanescent wave, in principle, does not couple with the material on top of the hydrophobic nanostructure or that the coupling is reduced. The height D of the protrusions may be at least 50 nm, or 75 nm, or 100 nm, or 125 nm, or 150 nm, or 175 nm, or 200 nm.

The protrusions 66 in FIG. 3a may be made of the same materials as the wavelength converting layer 3, or the protrusions 66 may be made of another material.

Figure 3B:
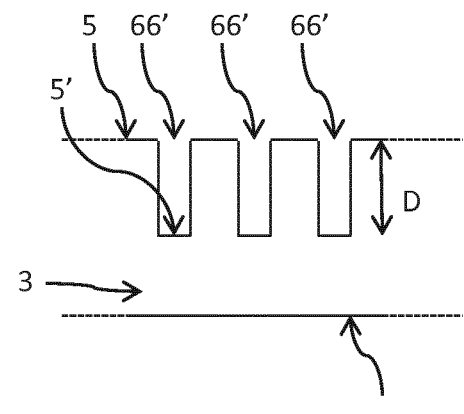

FIG. 3b shows a detailed side view of another hydrophobic nanostructure 6 comprising a plurality of spaced apart indentations 66'. For the sake of brevity, only three indentations 66' are shown in FIG. 3b, it is of course understood that a hydrophobic nanostructure comprises a large number of indentations, such as hundreds or even thousands of indentations 66'. Hence, it is understood that a hydrophobic nanostructure may also be created by spaced apart indentations 66' made from the material of the wavelength converting layer 3. The indentations 66' of course create protrusions between them such that the front side 5 of the wavelength converting layer may be seen as the bottom 5' of the indentations 66'.

Although the side views of the protrusions 66 and indentations 66' shows them having a rectangular shape, other shapes are of course possible and within the scope of the invention, such as a shape having a wider tip 66a than the base 66b or a pointed shape with a narrower tip 66a than base 66b.

The height of the protrusions 66 and indentations 66' are as mentioned in the range of 25 nm to at least 200 nm, the width of the protrusions 66 and indentations 66' may be in the range of 10 nm to 50 nm.

Figure 3C:
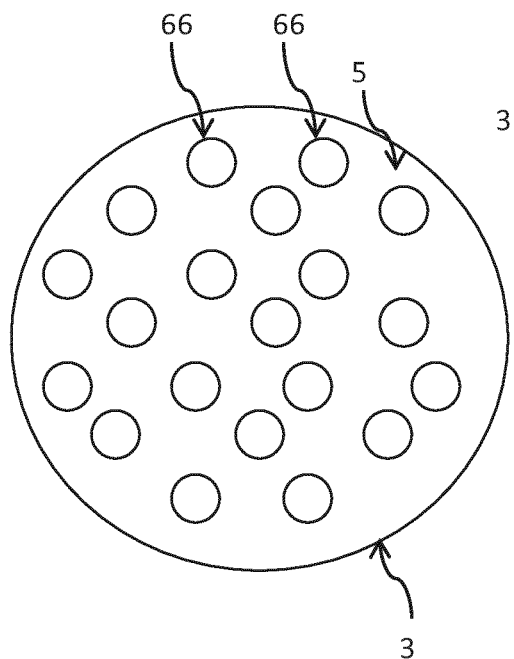
Figure 3D:
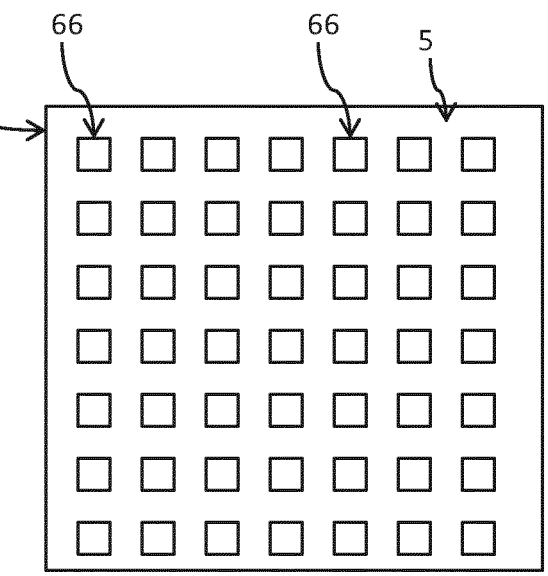

FIGS. 3c and 3d shows a schematic top-down view of the front side 5, i.e. the exit window, of a light converting device. Note that the exit window, i.e. the front side of the wavelength converting layer 3 has a circular shape in FIG. 3c and a square shape in FIG. 3d. Other shapes are of course possible and within the scope of the invention. The width of the exit window at the widest point may be in the range of 1 mm to 8 mm, for example 2.6 mm.

A plurality of protrusions 66 are arranged on the front side 5 as described in conjunction with FIGS. 1a and 1b. Note that there is no specific order to the placement of the protrusions 66 in FIG. 3c, whereas the protrusions 66 in FIG. 3d are aligned in rows and columns. Both options, i.e. randomization or order, are equally viable to produce the desired hydrophobic effect. In the case of indentations 66' instead of the protrusions 66 as shown in FIG. 3b, the indentations may be made by elongated grooves crossing a portion of, or the entire length of the front side 5 to create spaced apart protrusions between the indentations 66'.

Figure 4A:
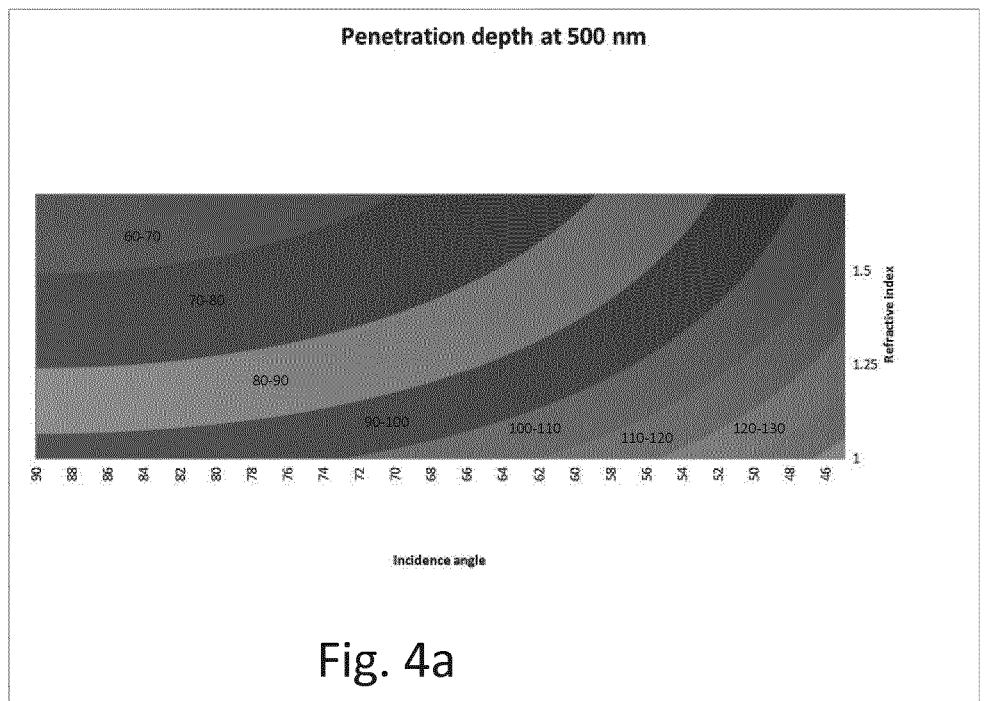
FIG. 4a-b are plots showing the required height of a nanostructure to avoid a coupling of an evanescent wave based on the angle of incidence and refractive index.

FIG. 4a shows a plot of incidence angle (horizontal axis) versus refractive index (vertical axis) for light having a wavelength of 500 nm. The number, i.e. range, in each field corresponds to the penetration depth. The critical angle for total internal reflection may be calculated using Snell's law with knowledge of the refractive indices of a first and second medium, i.e. the wavelength converting material and air.

The penetration depth of the evanescent wave of the light is calculated according to the equation below, where $d_p$ is the penetration depth, $\lambda_0$ the wavelength of the incident light, $\theta_1$ the incidence angle in the first medium (i.e. the wavelength converting layer 3), $\eta_1$ and $\eta_2$ being the refractive index of the first and second medium (i.e. the wavelength converting layer 3 and the air layer created by the hydrophobic nanostructure 6), respectively.

$$d_v = \lambda_0 / (2\pi \cdot \eta_1 \sqrt{\sin^2\theta_1 - (\eta_2/\eta_1)^2})$$

Further, it is known that the penetration depth is exponential decaying; therefore it is in principle the first refraction, i.e. between the wavelength converting layer and the air layer, which provides the largest result. It is thus possible to provide a hydrophobic nanostructure which has a height less than the penetration depth, which still provides a reduced color shift. Hence, depending on the thickness of the air layer, corresponding to the height of the hydrophobic nanostructure, the color performance of the light converting device can be tuned. An air layer thicker than the penetration depth, i.e. a hydrophobic nanostructure having a height larger than the penetration depth ensures that, in principle, no color shift occurs as the evanescent wave created by totally internally reflected light does not reach the material on top of the hydrophobic nanostructure and the unconverted light is thereby allowed another chance to be converted.

Figure 4B:
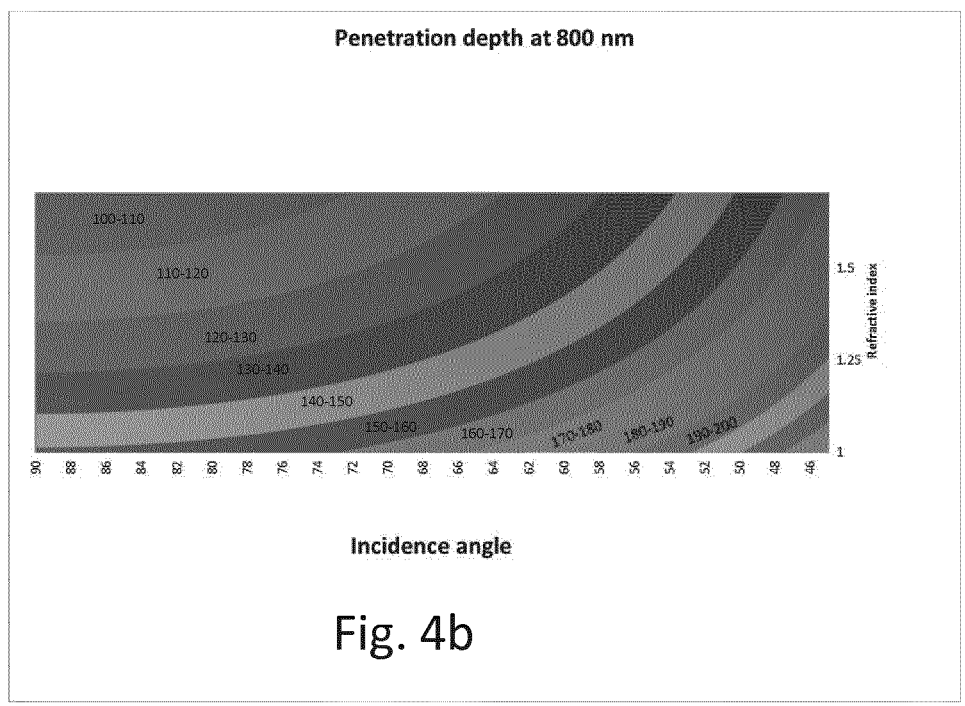

FIG. 4b shows a plot of incidence angle (horizontal axis) versus refractive index (vertical axis) for light having a wavelength of 800 nm. The plot in FIG. 4b shows that in order for a color shift to be avoided, the height of the hydrophobic nanostructure may be chosen such that even light having a long wavelength, such as red at approximately 800 nm interacts with the air layer instead of the material on top of the hydrophobic nanostructure. Hence, in order to avoid coupling of light having a wavelength in the upper reaches of visible light, of about 800 nm, for a wavelength converting layer having a refractive index of 1.5, an air layer having a thickness of about 180 nm is needed for an angle of incidence of about 45 degrees.

Figure 5:
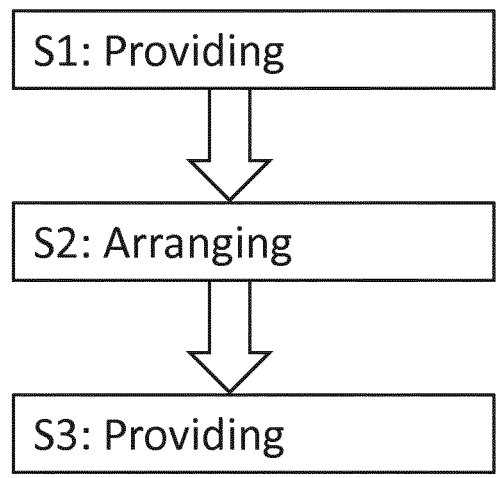
FIG. 5 is a flowchart outlining an exemplary method for manufacturing a light converting device in accordance with different embodiments of the invention.

FIG. 5 shows an exemplary method for manufacturing a light converting device, such as the light converting device 1 show in FIG. 1 or the light converting device 11 shown in FIG. 2.

The method a first step S1 of providing a providing a solid state light source 2, and a second step S2 of arranging a wavelength converting layer 3 to at least partly wavelength convert the light emitted, in use, by the solid state light source 2, the wavelength converting layer 3 having a backside 4 facing the light source 2 and a front side 5 opposite the backside, wherein the front side 5 of the wavelength converting layer defines an exit window of the light converting device 1.

The subsequent step S3 comprises providing a hydrophobic nanostructure 6 provided on the front side 6 of the wavelength converting layer. In an alternative embodiment it is of course possible to provide the hydrophobic nanostructure 6 on the front side 5 wavelength converting layer prior to arranging the wavelength converting layer 3 to at least partly wavelength convert the light emitted by the light source 2.

The step of providing a hydrophobic nanostructure arranged on the front side of the wavelength converting layer may comprise either removing material from the wavelength converting layer 3 to provide the hydrophobic nanostructure 6, or adding material to the wavelength converting layer 3 to provide the hydrophobic nanostructure. Adding material to the wavelength converting layer 3 should be understood to either add the same material as the wavelength converting layer 3, or adding another, separate, material to the front side 5 of the wavelength converting layer 3. Removing material may comprise utilizing at least one of laser ablation, etching, or a phase mask. Adding material may comprise utilizing a self-assembled array or vapor deposition.

It is of course possible to use other methods known in the art to either add or remove material from the wavelength converting layer 3. Alternatively, the wavelength converting layer 3 may be provided with the hydrophobic nanostructure 6 during manufacture of the wavelength converting layer 3.

The method may further comprise a step of applying a hydrophobic coating on the front side of the wavelength converting layer and the hydrophobic nanostructure. The method may further comprise the step of providing a protective coating on top of the hydrophobic nanostructure.

Figure 6:
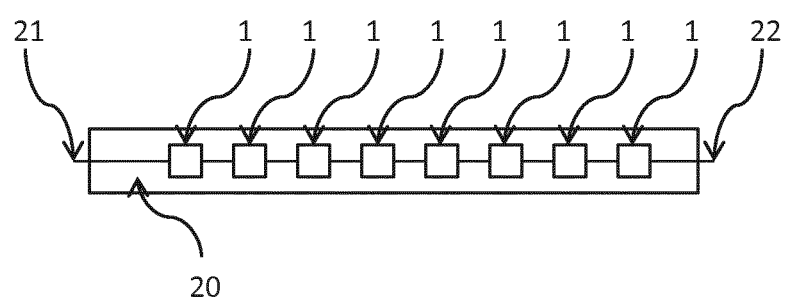
FIG. 6 is a top view of an exemplary embodiment of a lighting system comprising light converting devices in accordance with embodiments of the invention.

FIG. 6 shows a top view of an exemplary embodiment of a lighting system. The lighting system comprises a plurality of light converting devices 1 arranged on an elongated carrier 20. The elongated carrier 20 may be a printed circuit board (PCB), or another type of carrier. The light converting devices 1 are electrically connected to power wires 21, 22 from which electricity is fed such that the solid state light source of each light converting device 1, in use, emits light. The carrier 20 and the light converting devices 1 thereupon may be covered by a protective coating, thereby creating a sealed 'strip' which provide general purpose lighting. Other shapes than just elongated are of course possible and envisioned for the carrier and within the scope of the present invention. The light converting devices presented above may be used to advantage with many different types of lighting systems.

Although an "air layer" is referred to in the above, it is of course to use any gas with the present invention, the modification being to substitute the refractive index of air for the gas used in the above calculation to provide a hydrophobic nanostructure that creates a gas layer of sufficient thickness to achieve the desired effect. Any gas suitable for use with lighting application may be used.

The person skilled in the art realizes that the present invention by no means is limited to the preferred embodiments described above. On the contrary, many modifications and variations are possible within the scope of the appended claims. For example, the shape of the protrusion of the nanostructure is not limited to the shapes shown in the appended drawings, other shapes providing a hydrophobic effect may be used to advantage with the present invention. Moreover, a light converting device according to the present invention may be tuned by altering the refractive index of the wavelength converting layer and the height of the hydrophobic nanostructure to avoid coupling of certain wavelengths to materials present on top of the hydrophobic nanostructure.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light converting device comprising:
a solid state light source;
a wavelength converting layer arranged to at least partly wavelength convert the light emitted by the solid state light source, the wavelength converting layer having a back side facing the solid state light source and a front side opposite the backside, wherein the front side of the wavelength converting layer defines an exit window of the light converting device;
wherein the light converting device further comprises a hydrophobic nanostructure having spaced apart protrusions, the protrusions being provided on the front side of the wavelength converting layer, and having a height (D) above the front side of the wavelength converting layer,
wherein an air layer is positioned above the front side of the wavelength converting layer, extending along the height of the protrusions,
wherein the height (D) of the spaced apart protrusions is selected to be larger than the penetration (dp) into the hydrophobic nanostructure of an evanescent wave of light being totally internally reflected at a junction of the front side of the wavelength converting layer and the air layer, and
wherein the light converting device further comprising a protective coating applied on top of the hydrophobic nanostructure.

2. The light converting device according to claim 1, wherein the height (D) of the hydrophobic nanostructure is at least 50 nm, or 75 nm, or 100 nm, or 125 nm, or 150 nm, or 175 nm, or 200 nm.

3. The light converting device according to claim 1, further comprising a hydrophobic coating on the front side of the wavelength converting layer.

4. The light converting device according to claim 1, wherein the protective coating is silicone or polyurethane.

5. A lighting system comprising a plurality of light converting devices according to claim 1 arranged on a carrier and electrically connected to each other, wherein the protective coating forms a seal.

6. A method for manufacturing a light converting device, the method comprises the steps of;
providing a solid state light source;
arranging a wavelength converting layer to at least partly wavelength convert the light emitted, in use, by the solid state light source, the wavelength converting layer having a backside facing the solid state light source and a front side opposite the backside, wherein the front side of the wavelength converting layer defines an exit window of the light converting device; and
providing a hydrophobic nanostructure having spaced apart protrusions on the front side of the wavelength converting layer, further comprising adding material to the wavelength converting layer to provide the hydrophobic nanostructure,
further providing a protective coating on top of the hydrophobic nanostructure.

* * * * *